(12) United States Patent
Ye

(10) Patent No.: US 10,516,014 B2
(45) Date of Patent: Dec. 24, 2019

(54) TOUCH OLED DISPLAY PANEL AND DISPLAY APPARATUS

(71) Applicant: Wuhan China Star Optoelectronics Semiconductor Display Technology Co., Ltd., Wuhan, Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 134 days.

(21) Appl. No.: 15/578,277

(22) PCT Filed: Aug. 18, 2017

(86) PCT No.: PCT/CN2017/098138
§ 371 (c)(1),
(2) Date: Nov. 30, 2017

(87) PCT Pub. No.: WO2019/019235
PCT Pub. Date: Jan. 31, 2019

(65) Prior Publication Data
US 2019/0221630 A1 Jul. 18, 2019

(30) Foreign Application Priority Data

Jul. 28, 2017 (CN) .......................... 2017 1 0632023

(51) Int. Cl.
*H01L 27/32* (2006.01)
*G06F 3/041* (2006.01)

(52) U.S. Cl.
CPC ........ *H01L 27/3276* (2013.01); *G06F 3/0412* (2013.01); *G06F 3/0416* (2013.01); *H01L 27/323* (2013.01)

(58) Field of Classification Search
CPC combination set(s) only.
See application file for complete search history.

(56) References Cited

U.S. PATENT DOCUMENTS

2011/0316803 A1* 12/2011 Kim ........................ G06F 3/044
345/173
2012/0319966 A1* 12/2012 Reynolds ................ G06F 3/041
345/173

(Continued)

FOREIGN PATENT DOCUMENTS

CN 203480450 3/2014
CN 104598074 A 5/2015

(Continued)

*Primary Examiner* — Deeprose Subedi
(74) *Attorney, Agent, or Firm* — Hemisphere Law, PLLC; Zhigang Ma

(57) ABSTRACT

The disclosure discloses a touch OLED display panel, including an array substrate, a light emitting structure layer, and a thin film encapsulation layer encapsulating the light emitting structure layer on the array substrate and including a sidewall located around the light emitting structure; a touch structure layer is disposed on a first surface of the thin film encapsulation layer, and the sidewall includes a first via hole communicating with the touch structure layer and the array substrate, and the touch OLED display panel further includes a bonding area; the first via hole is configured as a signal wire channel, and a touch signal wire in the touch structure layer and a display signal wire in the array substrate are simultaneously connected by the guidance of the first via hole to the bonding area and shares the bonding area. The disclosure also discloses a display apparatus including the OLED display panel.

18 Claims, 3 Drawing Sheets

(56) References Cited

U.S. PATENT DOCUMENTS

2014/0184951 A1 7/2014 Yeh et al.
2018/0069054 A1* 3/2018 Zhai .................. H01L 27/323

FOREIGN PATENT DOCUMENTS

| CN | 205944094 U | 2/2017 |
|----|-------------|--------|
| CN | 106505089   | 3/2017 |
| CN | 106648204 A | 5/2017 |
| CN | 106708342   | 5/2017 |
| CN | 106876431   | 6/2017 |
| CN | 106951125 A | 7/2017 |
| CN | 107068720   | 8/2017 |

* cited by examiner

TOUCH OLED DISPLAY PANEL AND DISPLAY APPARATUS

RELATED APPLICATIONS

The present application is a National Phase of International Application Number PCT/CN2017/098138, filed Aug. 18, 2017, and claims the priority of China Application No. 201710632023.8, filed Jul. 28, 2017.

FIELD OF THE DISCLOSURE

The disclosure relates to the field of display technology, and more particularly to a touch OLED display panel and a display apparatus including the touch OLED display panel.

BACKGROUND

The organic light-emitting diodes (OLED) display panel is a display device encapsulated by using an organic material, having advantages such as low operating voltage, fast response, high luminous efficiency, wide viewing angle, and wide operating temperature, and is conducive to thinness, low power, and surface design for the display device.

In the technology of integrating the OLED display panel and the touch panel, the OLED display panel and the touch panel are generally formed separately and then stacked together to form a complete touch display apparatus. This structure results in increase of the overall thickness of the OLED device, and is not conducive to thinness design of the product.

In order to improve the problem of thicker thickness, in some existing touch OLED display panels, touch electrodes arranged in an array are directly fabricated in the OLED display panel. In such an OLED display panel, the touch electrodes and the array substrate are located at different structural layers. The display signal wire (data line and scan line) on the array substrate includes a bonding area, and the display signal wire is connected to the display driving chip on the motherboard through a flexible printed circuit (FPC) board in the bonding area; the touch signal wire (Tx/Rx) corresponding to the touch electrode includes another bonding area, and the touch signal wire is connected to the touch driving chip on the motherboard through another flexible printed circuit board in the bonding area.

In the above touch OLED display panel, the array substrate and the touch layer are respectively provided with bonding areas, the two flexible printed circuit boards need to be connected by using two times of bonding processes, and the display signal wire and touch signal wire are respectively connected to the corresponding driving chips on the motherboard.

Therefore, the prior art still needs to be improved and developed.

SUMMARY

In view of the shortcomings of the prior art, the disclosure provides a touch OLED display panel, and a touch structure layer is disposed in the OLED display panel to reduce the overall thickness of the OLED display apparatus. In addition, by providing signal wire channels, the touch signal wire and the display signal wire can share a bonding area, and only one flexible printed circuit board is required to connect the touch wire and the display signal wire to the driving chips on the motherboard.

In order to achieve the object, the disclosure adopts the following technical proposal:

a touch OLED display panel, includes an array substrate, a light emitting structure layer disposed on the array substrate, and a thin film encapsulation layer encapsulating the light emitting structure layer on the array substrate, and the thin film encapsulation layer includes sidewall located around the light emitting structure layer, a touch structure layer is disposed on a first surface of the thin film encapsulation layer, and the sidewall includes a first via hole communicating with the touch structure layer and the array substrate, and the touch OLED display panel further includes a bonding area; the first via hole is configured as a signal wire channel, and a touch signal wire in the touch structure layer and a display signal wire in the array substrate are simultaneously connected by the guidance of the first via hole to the bonding area and shares the bonding area.

The bonding area is disposed on the first surface of the thin film encapsulation layer, and the touch signal wire is connected to the display signal wire on the first surface and the display signal wire is extended to the first surface through the first via hole and is connected to the bonding area, the touch signal wire is connected to the display signal wire on the first surface and the display signal wire is extended to the first surface through the first via hole and is connected to the bonding area.

the bonding area is disposed on the array substrate, the display signal wire is connected to the bonding area in the array substrate, and the touch signal wire is extended to the array substrate through the first via hole and is connected to the bonding area.

The sidewall further includes a second via hole, the second via hole communicates with the first via hole and the sidewall, and the bonding area is disposed on an outer wall of the sidewall; the touch signal wire is extended to the outer wall of the sidewall through the first via hole and the second via hole and are connected to the bonding area, and the display signal wire is extended to the outer wall of the sidewall and is connected to the bonding area through the first via hole and the second via hole.

The touch structure layer includes touch driving electrodes and touch sensing electrodes, and the touch driving electrodes and the touch sensing electrodes are connected to the touch signal wire in a one-to-one correspondence.

The touch driving electrodes and the touch sensing electrodes are insulated from each other in the same structure layer.

The touch driving electrodes and the touch sensing electrodes are disposed in different structural layers, and an insulating layer is disposed between the touch driving electrodes and the touch sensing electrodes.

The light emitting structure layer includes an anode, an organic light emitting layer, and a cathode sequentially disposed on the array substrate.

the touch OLED display panel further includes a driving module, and the driving module includes a touch driving chip and a display driving chip; the touch driving chip and the display driving chip are connected to the bonding area through a flexible printed circuit board, the flexible printed circuit board is electrically connected to the touch signal wire and the display signal wire in the bonding area; the touch driving chip is in communication with the touch signal wire, and the display driving chip is in communication with the display signal wire.

The disclosure further provides a display apparatus, including the touch OLED display panel.

Compared with the prior art, the touch OLED display panel provided by the embodiment of the disclosure firstly disposes the touch structure layer in the OLED display panel to reduce the overall thickness of the OLED display apparatus. In addition, the thin film encapsulation layer includes a first via hole communicating with the touch structure layer and the array substrate, the first via hole is configured as a signal wire channel, and a touch signal wire in the touch structure layer and a display signal wire in the array substrate can share the bonding area, and only one flexible printed circuit board is required to connect the touch wire and the display signal wire to the driving chips on the motherboard. By reducing the times of the bonding processes, the stability of the signal wire connection in the panel is improved; by reducing the number of the flexible printed circuit board, the space occupied by the flexible printed circuit board is saved, the development of thinness and narrow bezels of the OLED display panels is facilitated.

DETAILED DESCRIPTION OF PREFERRED EMBODIMENTS

Figure 1:
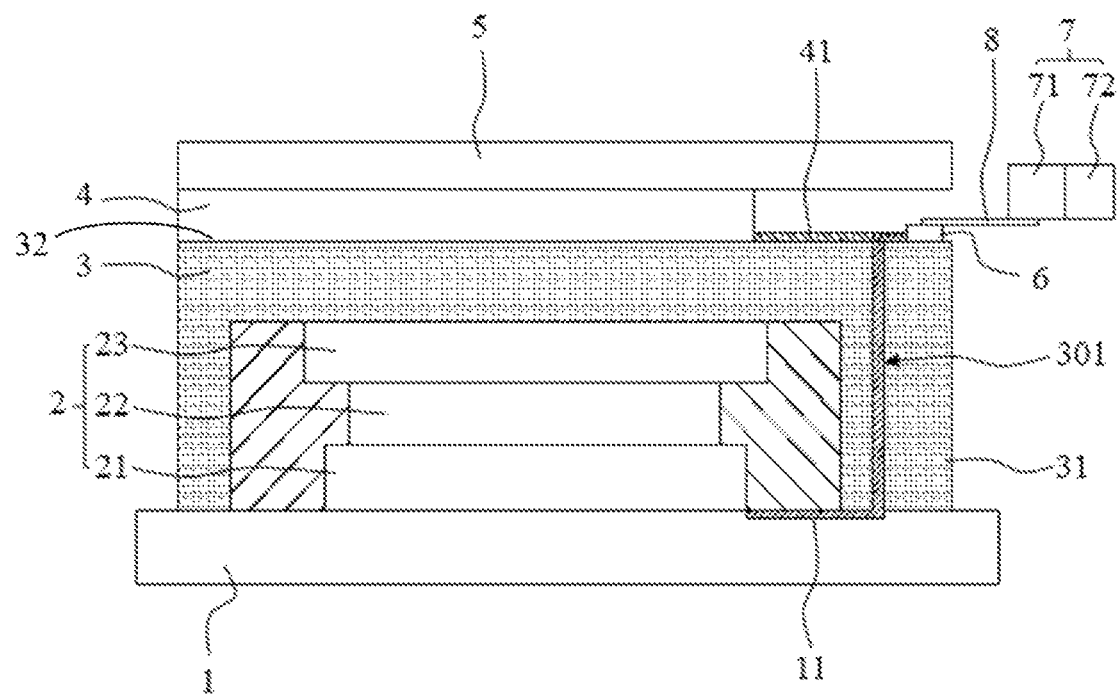
FIG. 1 is a structural diagram of a touch OLED display panel provided in the Embodiment 1 of the disclosure.

To make the objectives, technical solutions, and advantages of the disclosure clearer, the following describes the specific implementation manners of the disclosure in detail with reference to the accompanying drawings. Examples of the preferred embodiments are illustrated in the accompanying drawings. The embodiments of the disclosure shown in the drawings and described in the drawings are merely exemplary and the disclosure is not limited to these embodiments.

Here, it should be further noted that in order to prevent the disclosure to be obscured due to unnecessary details, only apparatus structures and/or processing steps closely related to the solution according to the disclosure are shown in the accompanying drawings, while other details having little relations are omitted.

Embodiment 1

This embodiment provides a touch OLED display panel, as shown in FIG. 1, the touch OLED display panel includes an array substrate 1, a light emitting structure layer 2, and a thin film encapsulation layer 3. The array substrate 1 is a thin film transistor array substrate, which may be a rigid glass substrate or a flexible substrate, and a plurality of thin film transistors therein are arranged in an array. The light emitting structure layer 2 includes a plurality of organic light emitting pixel structures, including an anode 21, an organic light emitting layer 22, and a cathode 23 sequentially disposed on the array substrate 1. The thin film encapsulation layer 3 is used to encapsulate the light emitting structure layer 2 on the array substrate 1 for waterproof and dustproof effect. The thin film encapsulation layer 3 includes a sidewall 31 located around the light emitting structure layer 2. The array substrate 1 includes a display signal wire 11 for transmitting the display signal, and the display signal wire 11 may be, for example, a data line, scan line, etc.

In this embodiment, as shown in FIG. 1, a touch structure layer 4 is disposed on a first surface 32 of the thin film encapsulation layer 3, and a glass cover 5 is further disposed on the touch structure layer 4. In other preferred embodiments, a polarizer is further disposed between the touch structure layer 4 and the glass cover 5 for improving the contrast ratio of the display panel. The touch structure layer 4 includes a touch electrode and a touch signal wire 41 for transmitting a touch signal. Further, the touch structure layer 4 is directly formed on the thin film encapsulation layer 3 through a pattern process, that is, the touch structure layer 4 is disposed in the OLED display panel, thereby reducing the overall thickness of the OLED display apparatus, facilitating the achievement of lightweight and thinness of the OLED display apparatus.

In this embodiment, as shown in FIG. 1, the sidewall 31 of the thin film encapsulation layer 3 includes a first via hole 301 communicating with the touch structure layer 4 and the array substrate 1, and the first via hole 301 is configured as a signal wire channel. Specifically, the bonding area 6 is disposed on a first surface 32 of the thin film encapsulation layer 3, the touch signal wire 41 in the touch structure layer 4 is directly connected to the bonding area 6 on the first surface 32, and the display signal wire 11 in the array substrate 1 is extended to the first surface 32 through the guiding of the first via hole 301 and is connected to the bonding area 6. The touch signal wire 41 and the display signal wire 11 located in the different structure layers are finally extended to the same structure layer under the guidance of the first via hole 301 and share the same bonding area 6.

It should be noted that, after the display signal wire 11 is extended to the first surface 32, the display signal wire 11 should be arranged in a staggered arrangement with the touch signal wire 41, that is, the touch signal wire 41 and the display signal wire 11 are insulated from each other.

Further, as shown in FIG. 1, the touch OLED display panel further includes a driving module 7, and the drive module 7 includes a touch display driving chip 71 and a display driving chip 72, the touch driving chip 71 and the display driving chip 72 are connected to the bonding area 6 through a flexible printed circuit board 8, and the flexible printed circuit board 8 is electrically connected to the touch signal wire 41 and the display signal wire 11 in the bounding area 6. The touch driving chip 71 is in signal communication with the touch signal wire 41, and the display driving chip 72 is in signal communication with the display signal wire 11.

In the touch OLED display panel provided by the embodiment, only one bonding area 61 needs to be disposed, and the connection of the touch signal and the display signal can be simultaneously achieved through one bonding process, thereby reducing the number of flexible printed circuit board used.

Figure 2:
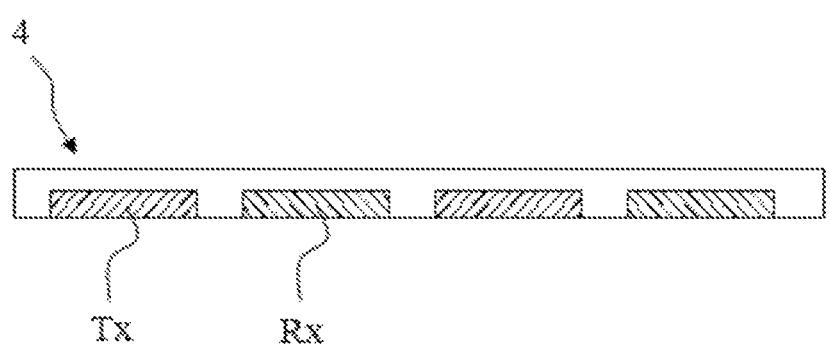
FIG. 2 is a structural diagram of a touch structure layer in the Embodiment 1 of the disclosure.

As described above, the touch structure layer 4 is directly formed on the thin film encapsulation layer 3 through a pattern process. Specifically, in this embodiment, as shown in FIG. 2, the touch structure layer 4 includes touch driving electrodes Tx and touch sensing electrodes Rx, and the touch driving electrodes Tx and the touch sensing electrodes Rx are insulated from each other and disposed in the same structure layer (same structure layer setting). Specifically, a conductive material layer is first fabricated, and then the conductive material layer is etched to form the patterned touch driving electrodes Tx and the touch sensing electrodes Rx through a pattern process. The touch driving electrode Tx and the touch sensing electrode Rx are connected to the touch signal wires 41 in one-to-one correspondence, that is, each touch driving electrode Tx is connected with one touch signal wire 41, and each touch sensing electrode Rx is also connected with one touch signal wire 41.

Embodiment 2

Figure 3:
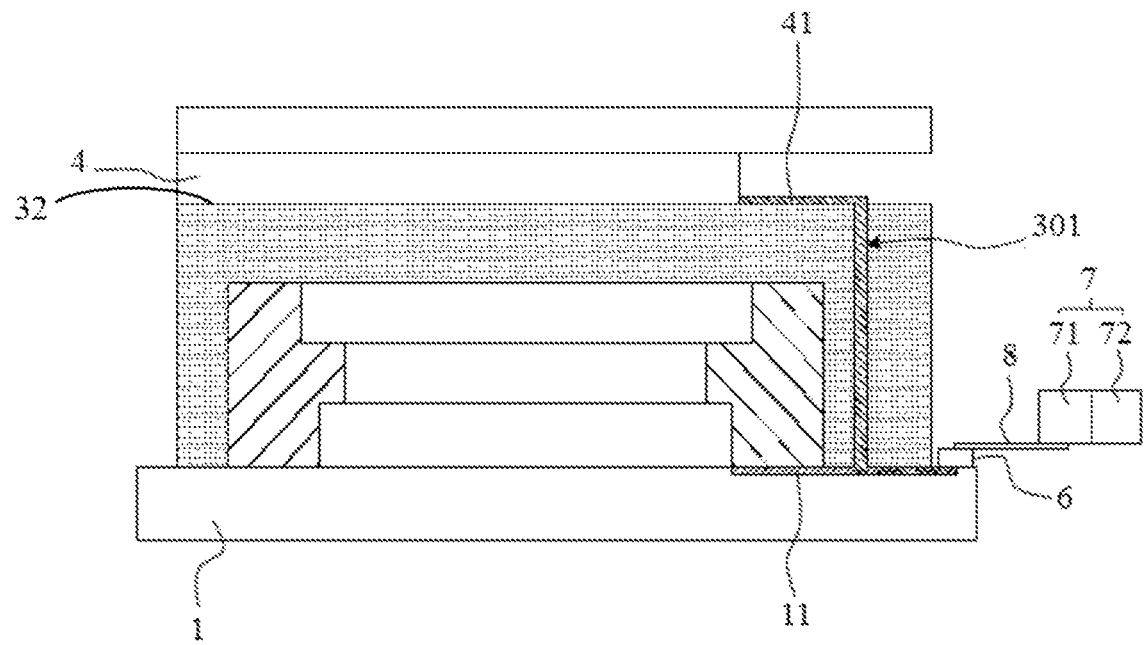
FIG. 3 is a structural diagram of a touch OLED display panel provided in Embodiment 2 of the disclosure.

The difference between this embodiment and Embodiment 1 is that, as shown in FIG. 3, in this embodiment the bonding area 6 is disposed on the array substrate 1, the display signal wire 11 is directly connected to the bonding area 6 in the array substrate 1, and the touch signal wire 41 in the touch structure layer 4 is extended to the array substrate 1 through the first via hole 301 and is connected to the bonding area 6. As a result, the touch signal wire 41 and the display signal wire 11 located in different structure layers are eventually extended to the same structure layer under the guidance of the first via hole 301, and share the same bonding area 6. At this time, the touch driving chip 71 and the display driving chip 72 of the driving module 7 are connected to the bonding area 6 located on the array substrate 1 through the flexible printed circuit board 8. The touch OLED display panel in this embodiment is also only required to dispose a bonding area 6, and the connection of the touch signal and the display signal can be simultaneously achieved through one bonding process, thereby reducing the number of flexible printed circuit board used.

It should be noted that, after the touch signal wire 41 is extended to the array substrate 1, the touch signal wire 41 should be arranged in a staggered arrangement with the display signal wires 11, that is, the touch signal wire 41 and the display signal wire 11 are insulated from each other.

Figure 4:
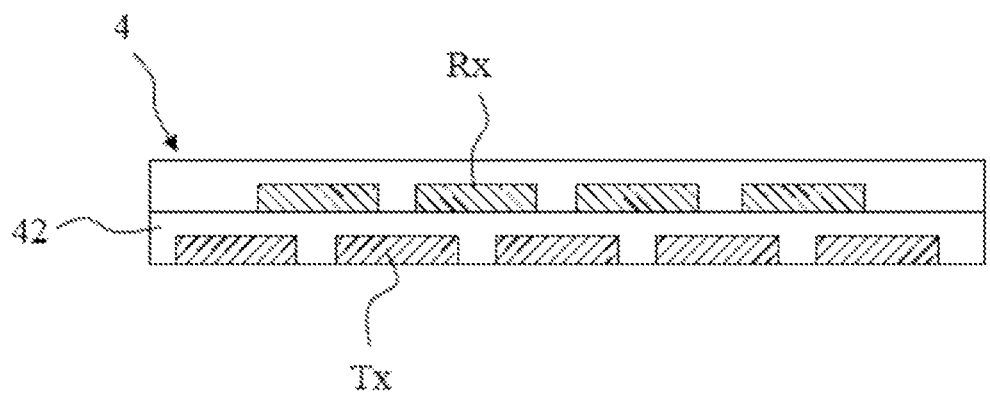
FIG. 4 is a structural diagram of a touch structure layer in Embodiment 2 of the disclosure.

In addition, in the present embodiment, as shown in FIG. 4, the touch driving electrodes Tx and touch sensing electrodes Rx are disposed in different structure layers (different structure layers setting), and an insulating layer 42 is disposed between the touch driving electrodes Tx and the touch sensing electrodes Rx.

It should be noted that, the structure of the touch structure layer 4 in this embodiment may also be provided in the same layer as that in Embodiment 1. Of course, in the Embodiment 1, the touch structure layer 4 may also be provided in different structure layers as that in this embodiment.

Embodiment 3

Figure 5:
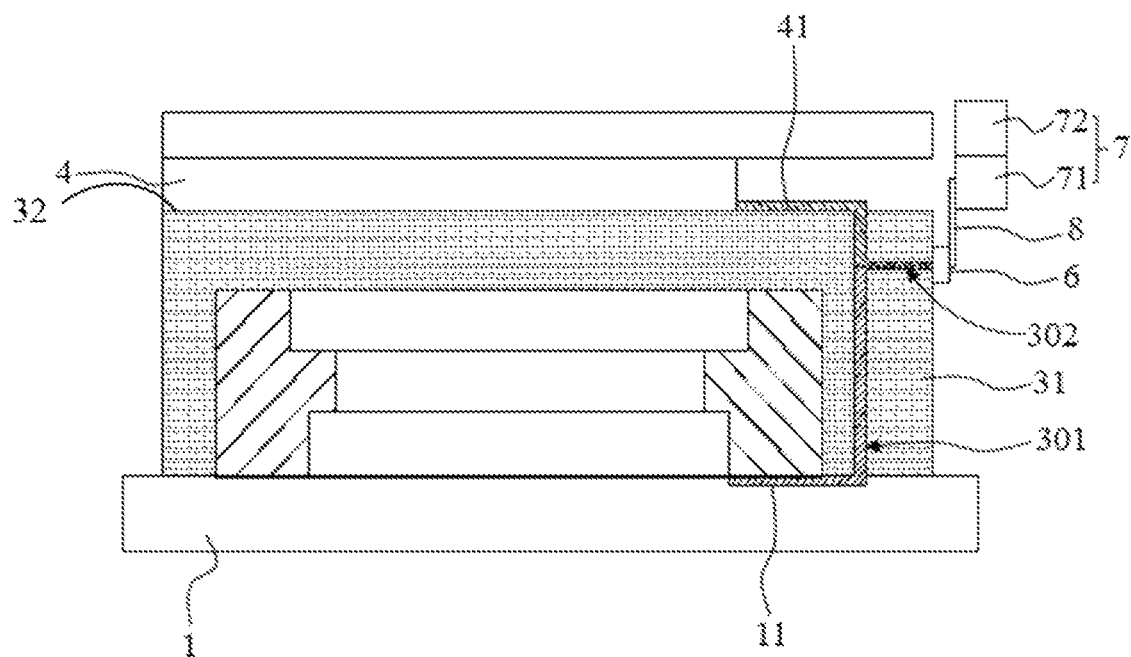
FIG. 5 is a structural diagram of a touch OLED display panel provided in Embodiment 3 of the disclosure.

The difference between this embodiment and Embodiment 1 is that, as shown in FIG. 5, in this embodiment the bonding area 6 is disposed on the outer wall of the sidewall 31 of the thin film encapsulation layer 3, A second via hole 302 is disposed in the sidewall 31, and the second via hole 302 communicates with the first via hole 301 and the outer wall of the sidewall 31. The display signal wire 11 in the array substrate 1 is extended to the outer wall of the sidewall 31 under the guidance of the first via hole 301 and the second via hole 302 and is connected to the bonding area 6; the touch signal wire 41 in the touch structure layer 4 is also extended to the outer wall of the sidewall 31 under the guidance of the first via hole 301 and the second via hole 302 and is connected to the bonding area 6. As a result, the touch signal wire 41 and the display signal wire 11 located in different structure layers are finally extended to the same structure layer under the guidance of the first via hole 301 and share the same bonding area 6. At this time, the touch driving chip 71 and the display driving chip 72 of the driving module 7 are connected to the bonding area 6 located on the array substrate 1 through the flexible printed circuit board 8. The touch OLED display panel in this embodiment is also only required to dispose a bonding area 6, and the connection of the touch signal and the display signal can be simultaneously achieved through one bonding process, thereby reducing the number of flexible printed circuit board used.

It should be noted that, after the touch signal wire 41 is extended to the array substrate 1, the touch signal wire 41 should be arranged in a staggered arrangement with the display signal wires 11, that is, the touch signal wire 41 and the display signal wire 11 are insulated from each other.

Embodiment 4

Figure 6:
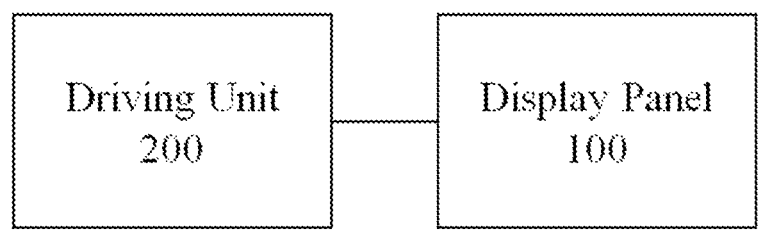
FIG. 6 is a structural diagram of a display apparatus provided in Embodiment 4 of the disclosure.

This embodiment provides a display apparatus, as shown in FIG. 6, the display apparatus includes a driving unit 200 and a display panel 100, the driving unit 200 supplies driving signal to the display panel 100 so that the display panel 100 displays picture. The display panel 100 adopts the touch OLED display panel provided in the above embodiments of the disclosure.

To sum up, the touch OLED display panel provided in the embodiments of the disclosure is that the touch structure layer is firstly disposed in the OLED display panel to reduce the overall thickness of the OLED display apparatus. In addition, a first via hole communicating with the touch structure layer and the array substrate is disposed in the thin film encapsulation layer. The first via hole is configured as a signal wire channel, and a touch signal wire in the touch structure layer and a display signal wire in the array substrate can share the bonding area, and only one flexible printed circuit board is required to connect the touch wire and the display signal wire to the driving chips on the motherboard. By reducing the times of the bonding processes, the stability of the signal wire connection in the panel is improved; by reducing the number of the flexible printed circuit board, the space occupied by the flexible printed circuit board is saved, the development of thinness and narrow bezels of the OLED display panels is facilitated.

It is to be noted that, in the context, relational terms such as first and second are used only to distinguish an entity or an operation from another entity or another operation without necessarily requiring or implying that such entities or operations have any such actual relationship or sequence. Moreover, terms "include", "comprise" or any other variant thereof is intended to encompass a non-exclusive inclusion such that processes, methods, articles, or devices that include a series of elements include not only those elements but also those that are not explicitly listed. In the absence of more restrictions, the elements defined by the statement "including a . . . " do not preclude the presence of additional elements in the process, method, article, or device that includes the elements.

It should be indicated that the present application can also be improved and modified by those skilled in the art without departing from the principle of the present application, and these improvements and modifications also fall within the protection scope of the claims of the present application.

What is claimed is:

1. A touch OLED display panel, comprising
an array substrate,
a light emitting structure layer disposed on the array substrate, and
a thin film encapsulation layer encapsulating the light emitting structure layer on the array substrate;
wherein the thin film encapsulation layer comprises a sidewall located around the light emitting structure layer, and a first via hole disposed within the sidewall of the thin film encapsulation layer; a touch structure layer is disposed on a first surface of the thin film encapsulation layer, the first via hole communicates with the touch structure layer and the array substrate, and the touch OLED display panel further comprises a bonding area;

wherein the first via hole is configured as a signal wire channel, a touch signal wire in the touch structure layer and a display signal wire in the array substrate are simultaneously connected to the bonding area through the first via hole and share the bonding area; and wherein the bonding area and the touch signal wire are disposed on the first surface of the thin film encapsulation layer away from the substrate, and the display signal wire is disposed on another surface of the thin film encapsulation layer opposite to the first surface.

2. The touch OLED display panel according to claim 1, wherein the touch signal wire is connected to the bonding area on the first surface, and the display signal wire is extended to the first surface through the first via hole and is connected to the bonding area.

3. The OLED touch display panel according to claim 1, wherein the bonding area is disposed on the array substrate, the display signal wire is connected to the bonding area in the array substrate, and the touch signal wire is extended to the array substrate through the first via hole and is connected to the bonding area.

4. The OLED touch display panel according to claim 1, wherein the sidewall further comprises a second via hole, the second via hole communicates with the first via hole and the sidewall, and the bonding area is disposed on an outer wall of the sidewall; the touch signal wire is extended to the outer wall of the sidewall through the first via hole and the second via hole and is connected to the bonding area, and the display signal wire is extended to the outer wall of the sidewall through the first via hole and the second via hole and is connected to the bonding area.

5. The touch OLED display panel according to claim 1, wherein the touch structure layer comprises touch driving electrodes and touch sensing electrodes, and the touch driving electrode and the touch sensing electrode are electrically connected to the touch signal wires in one-to-one correspondence.

6. The touch OLED display panel according to claim 5, wherein the touch driving electrodes and the touch sensing electrodes are insulated from each other in the same structure layer.

7. The touch OLED according to claim 5, wherein the touch driving electrodes and the touch sensing electrodes are disposed in different structural layers, and an insulating layer is disposed between the touch driving electrodes and the touch sensing electrodes.

8. The touch OLED display panel according to claim 1, wherein the light emitting structure layer comprises an anode, an organic light emitting layer and a cathode sequentially disposed on the array substrate.

9. The touch OLED display panel according to claim 1, wherein the touch OLED display panel further comprises a driving module, the driving module comprises a touch driving chip and a display driving chip, the touch driving chip and the display driving chip are connected to the bonding area through a flexible printed circuit board, the flexible printed circuit board is electrically connected to the touch signal wire and the display signal wire in the bonding area; the touch driving chip is in signal communication with the touch signal wire, and the display driving chip is in signal communication with the display signal wire.

10. A display apparatus comprising
a touch OLED display panel;
wherein the touch OLED display panel comprises an array substrate, a light emitting structure layer disposed on the array substrate, a thin film encapsulation layer encapsulating the light emitting structure layer on the array substrate, the thin film encapsulation layer comprising a sidewall located around the light emitting structure layer, and a first via hole disposed within the sidewall of the thin film encapsulation layer; a touch structure layer is disposed on a first surface of the thin film encapsulation layer, the first via hole communicating with the touch structure layer and the array substrate, and the touch OLED display panel further comprises a bonding area;

wherein the first via hole is configured as a signal wire channel, a touch signal wire in the touch structure layer and a display signal wire in the array substrate are simultaneously connected to the bonding area through the first via hole and share the bonding area; and wherein the bonding area and the touch signal wire are disposed on the first surface of the thin film encapsulation layer away from the substrate, and the display signal wire is disposed on another surface of the thin film encapsulation layer opposite to the first surface.

11. The display apparatus according to claim 10, wherein the touch signal wire is connected to the display signal wire on the first surface and the display signal wire is extended to the first surface through the first via hole and is connected to the bonding area.

12. The display apparatus according to claim 10, wherein the bonding area is disposed on the array substrate, the display signal wire is connected to the bonding area in the array substrate, and the touch signal wire is extended to the array substrate through the first via hole and is connected to the bonding area.

13. The display apparatus according to claim 10, wherein the sidewall further comprises a second via hole, the second via hole communicates with the first via hole and the sidewall, and the bonding area is disposed on an outer wall of the sidewall; the touch signal wire is extended to the outer wall of the sidewall through the first via hole and the second via hole and is connected to the bonding area, and the display signal wire is extended to the outer wall of the sidewall through the first via hole and the second via hole and is connected to the bonding area.

14. The display apparatus according to claim 10, wherein the touch structure layer comprises touch driving electrodes and touch sensing electrodes, and the touch driving electrode and the touch sensing electrode are electrically connected to the touch signal wires in one-to-one correspondence.

15. The display apparatus according to claim 14, wherein the touch driving electrodes and the touch sensing electrodes are insulated from each other in the same structure layer.

16. The display apparatus according to claim 14, wherein the touch driving electrodes and the touch sensing electrodes are disposed in different structural layers, and an insulating layer is disposed between the touch driving electrodes and the touch sensing electrodes.

17. The display apparatus according to claim 10, wherein the light emitting structure layer comprises an anode, an organic light emitting layer and a cathode sequentially disposed on the array substrate.

18. The display apparatus according to claim 10, wherein the touch OLED display panel further comprises a driving module, the driving module comprises a touch driving chip and a display driving chip, the touch driving chip and the display driving chip are connected to the bonding area through a flexible printed circuit board, the flexible printed circuit board is electrically connected to the touch signal wire and the display signal wire in the bonding area; the touch driving chip is in signal communication with the touch signal wire, and the display driving chip is in signal communication with the display signal wire.

\* \* \* \* \*